(12) United States Patent
Höhn et al.

(10) Patent No.: US 10,597,512 B2
(45) Date of Patent: Mar. 24, 2020

(54) OPTOELECTRONIC DEVICE WITH A MIXTURE HAVING A SILICONE AND A FLUORO-ORGANIC ADDITIVE

(71) Applicant: OSRAM Opto Semiconductors GmbH, Regensburg (DE)

(72) Inventors: Klaus Höhn, Forchheim (DE); Kathy Schmidtke, Mainburg (DE); Christina Keith, Neutraubling (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 48 days.

(21) Appl. No.: 15/565,116

(22) PCT Filed: Apr. 13, 2016

(86) PCT No.: PCT/EP2016/058129
§ 371 (c)(1),
(2) Date: Oct. 6, 2017

(87) PCT Pub. No.: WO2016/166164
PCT Pub. Date: Oct. 20, 2016

(65) Prior Publication Data
US 2018/0100054 A1   Apr. 12, 2018

(30) Foreign Application Priority Data
Apr. 14, 2015   (DE) .................. 10 2015 105 661

(51) Int. Cl.
*H01L 33/00* (2010.01)
*C08K 5/05* (2006.01)
(Continued)

(52) U.S. Cl.
CPC .............. *C08K 5/05* (2013.01); *C08K 5/02* (2013.01); *C08L 83/00* (2013.01); *C08L 83/04* (2013.01);
(Continued)

(58) Field of Classification Search
CPC ............ H01L 31/02327; H01L 31/024; H01L 33/486; H01L 33/56; H01L 33/58; H01L 33/641; C08K 5/05; C08L 83/04
(Continued)

(56) References Cited

U.S. PATENT DOCUMENTS 5,733,960 A   3/1998   Altes et al.
8,790,939 B2  7/2014   Preuss et al.
(Continued)

FOREIGN PATENT DOCUMENTS

| DE | 202004005228 U1 | 5/2005 |
|---|---|---|
| DE | 102008014927 A1 | 8/2009 |
| DE | 102013104195 A1 | 10/2014 |
| JP | H1036689 A | 2/1998 |

(Continued)

*Primary Examiner* — Brook Kebede
(74) *Attorney, Agent, or Firm* — Slater Matsil, LLP

(57) ABSTRACT

An optoelectronic device with a mixture including silicone and a fluoro-organic additive is disclosed. In an embodiment the device includes at least one radiation-emitting or radiation-detecting semiconductor and a mixture including silicone and a fluoro-organic additive. The mixture may be a component of at least one of the following elements: a package body element surrounding the at least one semiconductor at least in places, a radiation-guiding element arranged in a beam path of a radiation emitted by the semiconductor or detected by the semiconductor, a heat-conducting element configured to conduct heat emitted by the semiconductor or received by the semiconductor, or an adhesive element.

16 Claims, 2 Drawing Sheets

(51) Int. Cl.
*H01L 33/56* (2010.01)
*C08L 83/04* (2006.01)
*C08K 5/02* (2006.01)
*C08L 83/00* (2006.01)
*H01L 31/0203* (2014.01)
*H01L 31/0232* (2014.01)
*H01L 31/024* (2014.01)
*H01L 33/58* (2010.01)
*H01L 33/64* (2010.01)

(52) U.S. Cl.
CPC ........ *H01L 31/0203* (2013.01); *H01L 31/024* (2013.01); *H01L 31/02327* (2013.01); *H01L 33/56* (2013.01); *H01L 33/58* (2013.01); *H01L 33/641* (2013.01); *C08L 2203/206* (2013.01); *C08L 2205/025* (2013.01); *H01L 2224/32225* (2013.01); *H01L 2933/005* (2013.01); *H01L 2933/0058* (2013.01); *H01L 2933/0075* (2013.01)

(58) Field of Classification Search
USPC .................................................... 257/98–102
See application file for complete search history.

(56) References Cited

U.S. PATENT DOCUMENTS

| | | | |
|---|---|---|---|
| 9,018,777 | B2 | 4/2015 | Chun et al. |
| 9,620,674 | B2 | 4/2017 | Dirscherl |
| 2007/0131957 | A1 | 6/2007 | Brunner et al. |
| 2008/0048199 | A1 | 2/2008 | Ng |
| 2010/0227148 | A1 | 9/2010 | Jariwala et al. |
| 2012/0146077 | A1* | 6/2012 | Nakatsu ............... H01L 33/486 257/98 |
| 2012/0306356 | A1* | 12/2012 | Yoon .................... C04B 35/597 313/503 |
| 2015/0162511 | A1* | 6/2015 | Washizu ............... H01L 33/60 257/98 |

FOREIGN PATENT DOCUMENTS

| | | |
|---|---|---|
| JP | 2002053805 A | 2/2002 |
| JP | 2007009216 A | 1/2007 |
| JP | 2009138074 A | 6/2009 |
| JP | 2010529263 A | 8/2010 |
| JP | 2012131985 A | 7/2012 |
| JP | 2012533673 A | 12/2012 |
| JP | 2014015587 A | 1/2014 |
| JP | 2014210843 A | 11/2014 |
| WO | 2012073899 A1 | 6/2012 |

* cited by examiner

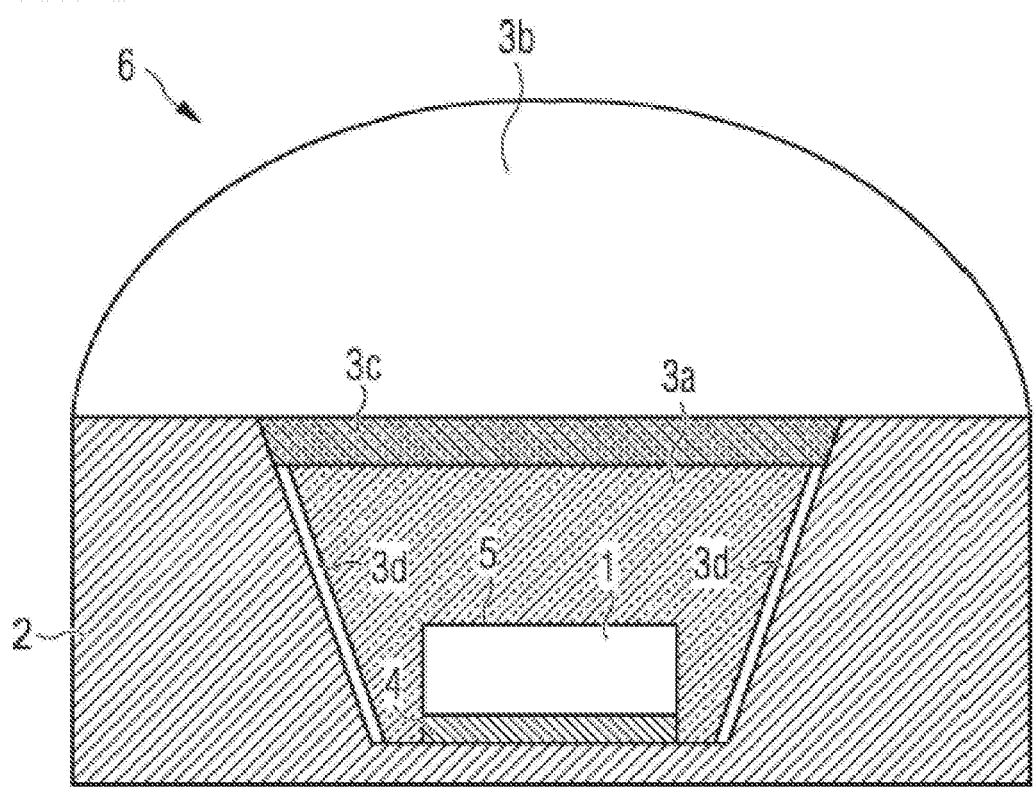

OPTOELECTRONIC DEVICE WITH A MIXTURE HAVING A SILICONE AND A FLUORO-ORGANIC ADDITIVE

This patent application is a national phase filing under section 371 of PCT/EP2016/058129, filed Apr. 13, 2016, which claims the priority of German patent application 10 2015 105 661.5, filed Apr. 14, 2015, each of which is incorporated herein by reference in its entirety.

TECHNICAL FIELD

The present invention relates to an optoelectronic device and a method for the production thereof.

SUMMARY OF THE INVENTION

Embodiments provide an optoelectronic device having improved stability, in particular, improved moisture resistance and weathering resistance.

Embodiments provide an optoelectronic device comprising at least one radiation-emitting or radiation-detecting semiconductor and a mixture having a silicone and a fluoro-organic additive. The said mixture is a component of at least one of the following elements: a package body element, which surrounds the at least one semiconductor at least in places, a radiation-guiding element, which is arranged in a beam path of the radiation emitted by the semiconductor or detected by the semiconductor, a heat-conducting element, which can conduct heat emitted by the semiconductor or received by the semiconductor, an adhesive element.

The optoelectronic device is therefore a radiation-emitting or radiation-detecting optoelectronic device having at least one corresponding optoelectronic semiconductor. The radiation detected or emitted by the semiconductor can be electromagnetic radiation, which can cover a range, e.g., from infrared light (IR radiation) to ultraviolet radiation (UV radiation). It can be, e.g., visible light. For example, the optoelectronic device can be an (inorganic) light-emitting diode (LED), an organic light-emitting diode (OLED), an optical sensor or a solar cell. In addition, the optoelectronic device can be a module comprising one or more LEDs, OLEDs, optical sensors and solar cells or combinations thereof.

The mixture of the device according to the invention comprises at least one silicone (polyorganosiloxane) and at least one fluoro-organic additive, wherein the silicone can, for example, form a matrix into which the fluoro-organic additive can be embedded. The mixture can also consist of the at least one silicone and the at least one fluoro-organic additive. It can also comprise or consist of precisely one silicone and precisely one fluoro-organic additive. The term mixture means in particular that the fluoro-organic additive is not only present on a surface of the silicone, but is distributed in the silicone. In particular, it is possible that the fluoro-organic additive is evenly distributed in the silicone. A fluoro-organic additive is to be understood as organic compounds comprising carbon-carbon bonds and carbon-fluorine bonds.

C—F bonds have particularly high stability. The bond strength is 441 kJ/mol (approx. 4.6 eV). This has a positive effect on the radiation resistance and light resistance of the mixture. In addition, Si has a very high affinity with fluorine. This leads to improved moisture and chemical resistance of the mixture, even when exposed to radiation, compared to silicones without a fluoro-organic additive.

The term chemical resistance here means, e.g., resistance to trace gases from atmospheric pollutants such as $H_2S$, $SO_2$, $NO_x$ (oxides of nitrogen) or $NH_3$. For example, the term chemical resistance also includes resistance to mineral salts, especially in outdoor applications in coastal areas. However, chemical resistance also means high stability towards solvents and cleaning agents as well as lacquer coatings (based, for instance, on acrylate or polyurethane), for instance in installation situations in displays and light modules.

The optoelectronic device comprises at least one of the following elements: package body element, radiation-guiding element, heat-conducting element, adhesive element.

The optoelectronic device can also comprise more than one or all of the above elements.

The element or the respective elements can, each independently of one another, comprise the said mixture or consist of the mixture. In particular, it is possible that one or more of the elements comprise the mixture, while other elements are free from the mixture.

The package body element is also referred to below as the package or package body. It surrounds the semiconductor at least partly. A radiation-guiding element can be understood to be either a radiation-transmitting element or a radiation-reflecting element. Radiation-transmitting elements can comprise or consist of, e.g., a potting material. In this case it is then possible in particular that the potting material comprises or consists of the mixture. Typical examples of radiation-transmitting elements are lenses and light-converting elements as well as the potting of the optoelectronic semiconductor. Light-converting elements are to be understood as elements which can at least partly convert a shorter-wavelength primary radiation to a longer-wavelength secondary radiation. In the case of the present invention, radiation-transmitting elements are also to be understood as light-converting elements in which primary radiation is completely converted to secondary radiation. In this case, the term "full conversion" is used.

In addition, a heat-conducting element and/or an adhesive element of the device can comprise or consist of the mixture. Heat-conducting or thermally conductive elements can, for example, efficiently dissipate heat emitted by the semiconductor. Adhesive elements can, for example, join together the semiconductor, the above-mentioned other elements or other parts of the optoelectronic device, acting as a glue, and ensure good adhesion to one another of the respective components in the device.

In the industrial production of conventional optoelectronic devices, silicones are used instead of the mixture according to the invention for the elements of optoelectronic devices described above. In contrast to the present invention, therefore, no fluoro-organic additive is added to the silicone in conventional devices.

The inventors of the present invention have found, however, that the use of conventional silicones often leads to deficiencies in the reliability of these optoelectronic devices. The cause has been found to be that exposure to moisture and thermal stresses in particular lead to delaminations in the interfacial region between silicone and other materials of the device. For example, delamination can occur between the silicone of an element or part of the device and a material of another part of the device which is in contact therewith. However, delamination can also occur between a silicone matrix and fillers embedded therein. This often leads to limitations to the service life of the optoelectronic device.

Compared to optoelectronic devices with conventional silicones, the device according to the invention, in which a fluoro-organic additive is added to the silicone, displays surprising property improvements in terms of moisture resistance, composite stability and thermal resistance.

The resistance of silicones to moisture and heat can be determined experimentally, e.g., via a weight increase after exposure of the mixture to moisture or a weight decrease after thermal stress. Corresponding evidence of the improved properties of the mixture according to the invention compared to conventional silicone without a fluoro-organic additive can be found in the exemplary embodiments.

Because of the improved tolerance to moisture, the optoelectronic devices according to the invention are particularly suitable for outdoor applications.

In addition, the mixtures have good thermal stability and good radiation resistance and light resistance. They are preferably transparent and resistant to yellowing. The mixtures of devices according to the invention can also be more readily marked, printed and wetted compared to silicones without a fluoro-organic additive. The present invention also represents a more cost-effective alternative to the use of fluoro-silicones, which is likewise conceivable. Fluoro-silicones are considerably more expensive and also more difficult to process than mixtures according to the invention. By comparison, the silicones and additives which form the mixture in the present case are each commercial, readily available, cost-effective materials. In the mixtures of optoelectronic devices according to the invention, e.g., simple silicones can be employed which, unlike fluoro-silicones which are expensive and difficult to produce, have substituents that are free from fluorine. These can be, e.g., two-component silicones with substituents that are free from fluorine. The positive effects resulting from the presence of fluorine are achieved in the mixture according to the invention by the fluoro-organic additive, while the natural silicone can be free from fluorine, for example, before mixing.

The mixtures of optoelectronic devices according to the invention can surprisingly be processed without great technical complexity using conventional methods, as employed for silicones without additives.

Preferred embodiments of the optoelectronic device according to the invention are provided below.

In a preferred development of the device according to the invention, the fluoro-organic additive is a compound comprising a functional group selected from a hydroxyl group, an epoxy group and a functional group having a C=C double bond. The functional group having a C=C double bond can be, e.g., a vinyl group. The functional group is covalently bound to an at least partly fluorinated alkyl group.

The inventors of the present invention have recognized that, by means of the aforementioned functional groups, fluoro-organic additives can be obtained which are readily miscible with silicones. For example, it is additionally possible to achieve a binding of the fluoro-organic compound to the silicone with the formation of a covalent bond using the said functional groups.

The at least partly fluorinated alkyl group can be a linear, branched or cyclic alkyl group. Preferably, it is a linear alkyl group. The chain length of the at least partly fluorinated alkyl group is preferably between two and twenty carbon atoms ($C_2$-$C_{20}$). Fluoro-organic additives with residues of this type are generally liquid and can therefore be mixed particularly simply and evenly into commercial silicones. The desired mixture can thus be obtained without great complexity and in good homogeneity. For the chain length, it can be preferred for it to comprise no more than sixteen, in particular no more than fourteen, more preferably no more than twelve carbon atoms. Often, the shorter the chain length, the better will be the miscibility. On the other hand, it is often preferred that the at least partly fluorinated alkyl group is not too short-chained. It can therefore be preferred for the fluorinated alkyl group to comprise at least three, in particular at least five, carbon atoms. In this way, the positive properties of the fluoro-organic additive can be fully exploited.

The covalent binding of the functional group to the at least partly fluorinated alkyl group can take place directly by a covalent bond between the functional group and the at least partly fluorinated alkyl group.

However, the covalent binding does not have to take place directly but can also take place via a linker group, which produces a covalent link between the functional group and the at least partly fluorinated group. The linker group is therefore arranged between the functional group and the at least partly fluorinated alkyl group. The linker group then forms a covalent bond with both the functional group and the at least partly fluorinated alkyl group.

According to a preferred embodiment, the linker group can be a branched or linear, unsubstituted or substituted alkyl group. For example, the alkyl group can comprise fluorine atoms or short-chain alkyl groups as substituents, wherein the latter can in turn be fluorinated. For example, the backbone of the alkyl group of the linker group has fewer than twenty carbon atoms. Preferably, the backbone of the alkyl group of the linker group has one to twelve carbon atoms ($C_1$ to $C_{12}$). More preferably, the backbone of the alkyl group of the linker group has between one and six carbon atoms ($C_1$-$C_6$); for example, between two and four carbon atoms. It is also preferred if the linker group is not substituted, i.e., has only hydrogen atoms as substituents. It is preferably a linear alkyl group.

In a preferred embodiment of the optoelectronic device according to the invention, the at least partly fluorinated alkyl group of the fluoro-organic additive is a perfluorinated alkyl group. The inventors of the present invention have recognized that a high degree of fluorination of the alkyl group has a positive effect on moisture resistance, chemical resistance and thermal and composite stability.

According to a particularly preferred embodiment of the optoelectronic device according to the invention, the fluoro-organic additive has the following general formula:

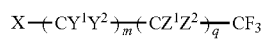

wherein the functional group X is selected from

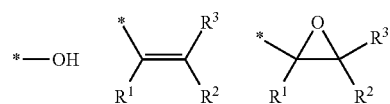

wherein $R^1$, $R^2$ and $R^3$, independently of one another, are a short-chain alkyl ($C_1$-$C_3$) or hydrogen, wherein $Y^1$, $Y^2$, $Z^1$ and $Z^2$, independently of one another, are selected from: fluorine, hydrogen, short-chain alkyl ($C_1$-$C_3$), in particular at least partly fluorinated short-chain alkyl ($C_1$-$C_3$), wherein m is an integer between 0 and 12, wherein q is an integer between 1 and 19, wherein at least one of the two substituents $Z^1$ or $Z^2$ is fluorine or an at least partly fluorinated short-chain alkyl ($C_1$-$C_3$), and wherein m+q≤19.

The fact that the sum of m and q is less than or equal to 19 ensures that the chain length of the linker group and the at least partly fluorinated alkyl group together totals less than or equal to 20 carbon atoms. The backbone of the total alkyl chain of linker group and at least partly fluorinated alkyl group therefore comprises fewer than or equal to 20 C atoms. Fluoro-organic compounds of this type are generally liquid. The fluoro-organic compounds described can therefore be mixed particularly well with silicones, and the resulting mixtures lend themselves well to further processing.

"*" here and below refers to the site at which the binding of the functional group to either the at least partly fluorinated alkyl group or the linker group takes place.

Among the functional groups X, the hydroxyl group is preferred. It enables fluoro-organic additives having particularly good miscibility with the silicone to be obtained. In addition, with hydroxyl groups, for example, a covalent and thus particularly stable binding to the silicone can be achieved. The hydroxyl group can furthermore improve the interfacial stability with polar or hydroxyl-containing substrate, filler or phosphor pigment surfaces via dipole-dipole interactions or through the formation of hydrogen bridge bonds. However, epoxy groups can also allow a covalent link to the silicone, e.g., by ring opening. It is likewise possible to achieve a covalent bond of the fluoro-organic additive to the silicone of the mixture with groups having a C=C double bond.

Short-chain alkyl residues ($C_1$-$C_3$) here and below mean in particular methyl, ethyl, n-propyl and isopropyl. These are suitable, e.g., for the residues $R^1$, $R^2$ and $R^3$. However, it is preferred if at least one, more preferably at least two, of the residues $R^1$ to $R^3$ are hydrogen. Most preferred is the case in which all three residues $R^1$ to $R^3$ are hydrogen. The more of the residues that are hydrogen, the more easily the double bond or epoxy group is sterically accessible, which can facilitate covalent binding.

The group —$(Y^1Y^2)_m$— acts as a linker group. It may be present—i.e., m is between 1 and 12 in this case—but it does not have to be present—i.e., m equals zero in this case. m is preferably greater than or equal to 1. m is more preferably between 1 and 10, more preferably between 1 and 6, for example, between 2 and 4. It is preferred in each case that $Y^1$ and $Y^2$ are each hydrogen.

The at least partly fluorinated group —$(CZ^1Z^2)_q$—$CF_3$ always has a q greater than zero. q is less than or equal to 19. It is possible, for example, for q to be less than or equal to 13. Furthermore, it is possible, for example, for q to be less than or equal to nine or even less than or equal to 5. It is also possible, for example, for q to be greater than or equal to one or greater than or equal to two. The inventors have recognized that moisture resistance and temperature resistance are favored by a high degree of fluorination. It is particularly preferred if both $Z^1$ and $Z^2$ comprise fluorine or a perfluorinated short-chain alkyl ($C_1$-$C_3$), for example, —$CF_3$, —$C_2F_5$ or —$C_3F$. It is particularly preferred if both $Z^1$ and $Z^2$ comprise fluorine or are fluorine.

According to a particularly preferred embodiment of the optoelectronic device according to the invention, the fluoro-organic additive is a compound of the following general formula:

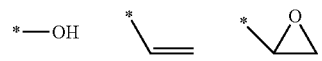

wherein X is selected from:

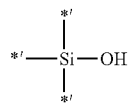

wherein m is an integer between 0 and 12, wherein n is an integer between 2 and 20, and wherein m+n≤20.

The sum of m and n is less than or equal to 20. Fluoro-organic additives of this type are generally liquid. They can be produced and display particularly good miscibility with conventional silicones. The above-mentioned functional groups can be utilized, e.g., for a covalent binding during the curing or crosslinking of the silicone, thus producing a particularly stable and moisture-repellent material. This leads to particularly moisture- and chemical-resistant optoelectronic devices. m is preferably between 1 and 6. However, m can also be zero. n is preferably between 2 and 14, more preferably between 2 and 10, for example, between 2 and 6.

In a particularly preferred development of the optoelectronic device according to the invention, the silicone and the fluoro-organic additive are present in the mixture having at least partly reacted with one another. The reaction can take place while the silicone cures, during which, e.g., an incorporation of the additive into the silicone network can take place. For example, it is possible that the fluoro-organic additive is covalently bound to the silicone by the functional group. A linkage of this type leads to a permanently stable mixture and thus to consistent properties and good reliability of the device.

A number of reactions will be presented below by means of which, for example, a covalent binding of the fluoro-organic additive to the silicone can take place.

The general structural formula

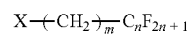

here denotes a hydroxyl group, which is part of the structure of the silicone of the present mixture. "*'" here denotes the binding of the silicon atom having the hydroxyl group to the further structure of the silicone.

R' below denotes the at least partly fluorinated alkyl group or the linker group and the at least partly fluorinated alkyl group.

R' is, e.g., according to the embodiments described above:

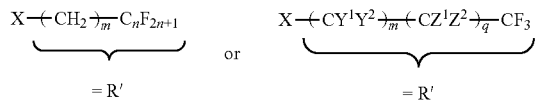

A binding to the silicone by means of the hydroxyl group as the functional group can take place, e.g., with the aid of a condensation reaction, in which, e.g., a hydroxyl group of the silicone and the hydroxyl group of the fluoro-organic additive can react with one another according to equation (1):

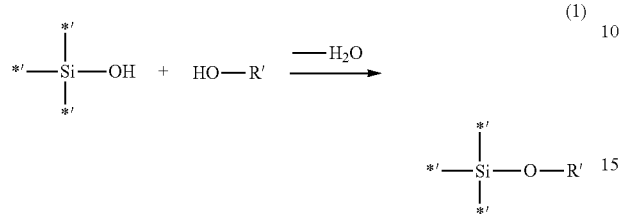

A covalent bond to the silicone can also be formed with an epoxy group as the functional group of the fluoro-organic additive in the course of a ring opening. This is shown by way of example in equation (2) for the reaction of an epoxy group with a hydroxyl group of the silicone:

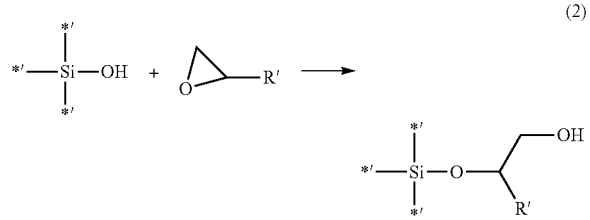

A binding to the silicone can also take place with a vinyl group as the functional group. This is possible, e.g., with the aid of a hydrosilylation reaction according to equation (3):

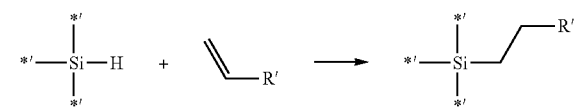

The formula

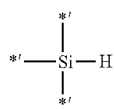

here denotes a structural unit of the silicone having an Si—H bond.

Alternatively, a binding to the silicone can also take place by means of free radicals via a vinyl group as the functional group. In this case, e.g., a radical initiator can be added for the initiation. Suitable radical initiators here are, e.g., peroxide-based radical initiators such as, for instance, dibenzoyl peroxide or other comparable radical initiators. These radical initiators can easily be thermally activated, for example, (e.g., at temperatures of between 60 and 100° C.), and can thus initiate the reactions that lead to a covalent binding of the fluoro additive to the silicone. When heated, peroxide-based radical initiators form, e.g., alkoxy radicals, which can in turn trigger a dyeradical addition. An illustrative example is shown in reaction (4):

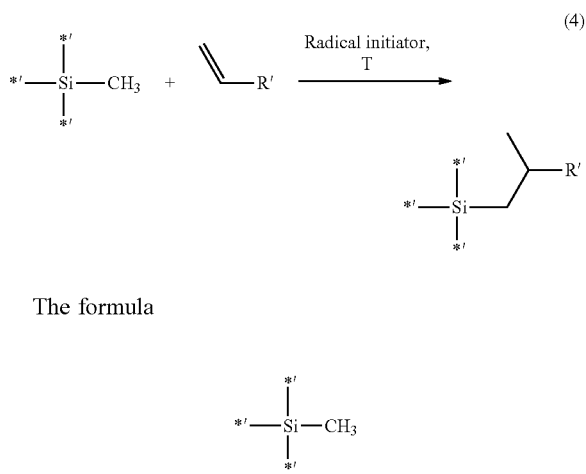

The formula here denotes a structural unit of the silicone having an alkyl group (in this example a methyl group), which can be activated by addition of a radical initiator during heating. The radical formed here reacts with the vinyl group, as a result of which a covalent binding of the fluoro-organic additive to the silicone is achieved.

According to one development of the invention, it is preferred if the fluoro-organic additive is evenly distributed in a matrix of the silicone and is covalently bound to the silicone. In this way, properties of the mixture can be achieved which are consistent not only over time but also spatially. For example, it is preferred if the binding of the fluoro-organic additive to the silicone takes place according to a random distribution.

According to another embodiment, the fluoro-organic additive is not bound to the silicone, at least in part. It is therefore not necessary for the fluoro-organic additive to be present having reacted, and in particular having completely reacted, with the silicone. Instead, it is also possible for at least some of the fluoro-organic additive not to be bound to the silicone, in which case the mixture can nevertheless enable good moisture resistance of the optoelectronic device. Furthermore, it is possible that some molecules of the fluoro-organic additive are bound to the silicone while other molecules of the fluoro-organic additive are not bound to the silicone.

Another development relates to an optoelectronic device according to the invention, wherein the proportion of the fluoro-organic additive in the mixture is between 0.2 and 10 wt. %, in particular between 0.5 and 5 wt. %.

In order for the desired increase in the moisture resistance of the optoelectronic device to be achieved, a certain minimum quantity of fluoro-organic additive is necessary, which is at least 0.2 wt. % of the additive in the mixture. The inventors have also found that the effect is enhanced if at least 0.5 wt. % of the additive is present in the overall mixture. Furthermore, it can be preferred if at least 1 wt. % of the additive is present.

The inventors have likewise observed that excessively large quantities of the fluoro-organic additive in the mixture lead to undesirable changes in properties. Thus, a particularly high proportion of the additive in the mixture leads to undesirable haze and a reduction in transparency. In addition, bubbles can form during fabrication of the device, e.g., while the mixture is curing. To avoid these undesirable effects, it is preferred if the proportion of additive in the mixture is less than 10 wt. % and better if it is less than or equal to 5 wt. % of the overall mixture. It can be further preferred if the proportion is less than or equal to 4 wt. % or even less than or equal to 3 wt. %.

A particularly preferred range is the range between 0.5 and 5 wt. %, in particular between 1 and 3 wt. %. The best properties are usually observed for mixtures with a proportion of approx. 2 wt. % of the fluoro-organic additive in the overall mixture. In this range, the moisture, chemical and temperature resistance and composite stability are affected particularly positively, which can be recognized, for example, by the low changes in mass during heat treatment and the low water vapor permeabilities. At the same time, these mixtures exhibit very good transparency without any significant undesirable bubble formation.

According to another development of the invention, the silicone of the mixture of the optoelectronic device according to the invention is a two-component silicone, in particular a heat-curing, addition-crosslinking, two-component silicone. It is preferably a silicone which is itself free from fluorine substituents and free from fluorinated substituents. The fluoro-organic additives described above can be readily mixed into the said silicones. In addition, the fluoro-organic additives can be incorporated directly into the silicone network while the silicones cure.

According to one development, the silicone can be a potting silicone. Mixtures of these silicones (for example, silicones with a hardness of Shore A 40) can be employed as potting materials. Silicones of this type are distinguished by good mechanical properties with good elongation at tear and elongation at break.

According to another development, the silicone can be a hard silicone, for example, a hard lens silicone (e.g., silicones with a hardness of Shore A 80). Silicones of this type have good mechanical properties with moderate elongation at tear and elongation at break. The inventors of the present invention have found that, in harder silicones, the positive properties can be affected by addition of the fluoro-organic additive particularly positively in terms of reduced water vapor transmission and thus moisture resistance overall. With silicones of this type, the water vapor transmission can often be reduced by more than 25%. These silicones are therefore particularly moisture resistant.

A particularly preferred embodiment of the optoelectronic device according to the invention relates to the device wherein the mixture has an interface with a material that differs from the mixture. The interface can be, e.g., one of the interfaces of one of the elements of the optoelectronic device with an element or component of the optoelectronic device that differs therefrom. For example, they can be interfaces between one of the following elements: semiconductor, package, radiation-guiding element, adhesive element, but also metal contactings and leads or other conventional components of the optoelectronic device. The inventors of the present invention have found that mixtures comprising silicone and the fluoro-organic additive permit good adhesion to almost all materials conventionally contained in optoelectronic devices. Optoelectronic devices according to the invention therefore display very good composite stability. Even when exposed to external chemicals or moisture, delamination is not usually observed in any significant way, which increases the reliability of the device.

A particularly preferred embodiment of the invention relates to the device according to the invention, wherein the mixture has an interface with a material that differs from the mixture and wherein the mixture is a matrix material and the material that differs from the mixture is filler particles, which are embedded in the matrix material.

The particles can be present in the matrix in an even distribution, for example.

Filler particles can be selected, e.g., from the group comprising heat-conductive particles, reflective particles and dye particles or particles of wavelength-converting substances. It is also possible, e.g., for multiple different types of fillers to be embedded in the matrix material at the same time.

The optoelectronic device according to the invention can comprise, e.g., a heat-conducting element, which contains the mixture comprising silicone and fluoro-organic additive as a matrix material or the matrix material consists thereof and contains heat-conductive particles as filler particles, which are embedded in the matrix material. These can be, for example, metal particles, such as Al, Cu, Ag, Au and Pd particles. Other heat-conductive materials can also be used, such as heat-conductive carbon materials, e.g., carbon black, graphite, carbon nanotubes (CNTs). However, particles composed of, e.g., cristobalite, $Al_2O_3$, BN or $ZrO_2$ are also suitable. It is likewise possible that the optoelectronic device contains a beam-guiding element which contains the mixture as a matrix material and filler particles which are embedded in the matrix material. For instance, the device can comprise a radiation-reflecting element which contains the mixture as a matrix material and reflective particles as filler particles. For example, these can be inorganic oxides, e.g., $SiO_2$, $TiO_2$ or $Al_2O_3$ particles. As reflective particles, for example, $CaF_2$, $CaCO_3$ or $BaSO_4$ are also suitable. The device can likewise comprise a radiation-transmitting element, which contains the mixture as a matrix material. If the radiation-transmitting element is a light-converting element, dye particles or wavelength-converting substances can be introduced into the matrix as filler particles. These can at least partly convert primary radiation to secondary radiation. This is radiation which is emitted by the semiconductor or detected by the semiconductor. For example, the particles can be ceramic particles, which can act as dyes or wavelength-converting substances. Suitable as wavelength-converting substances in this case are, for example, garnets, aluminates, halogen phosphates, chlorosilicates and nitride-based phosphors.

The inventors of the present invention have found that the mixture comprising silicone and the fluoro-organic additive are highly suitable as a matrix material for the various elements and various types of fillers. It reduces sensitivity to penetration of chemicals and moisture, even at elevated temperatures, so that a delamination or detachment between the matrix and the filler is reduced compared to conventional silicones without a fluoro-organic additive.

According to one development of the optoelectronic device according to the invention, the material that differs from the mixture (e.g., a filler or another element or another component of the optoelectronic device) is a material selected from the group of the following materials: metallic material, in particular Cu, Ag, Au, Pd and Al, heat-conductive carbon materials, in particular carbon black, graphite, carbon nanotubes (CNTs), oxides, nitrides, carbides, fluorides, carbonates, sulfates and/or ceramic material, in particular $SiO_2$, $Al_2O_3$, AlN, $Si_3N_4$, SiC, GaN, indium tin oxide (=ITO), ZnO, $SnO_2$, $CaCO_3$, $CaF_2$, $BaSO_4$, $ZrO_2$, $TiO_2$, BN, glass, polymers, silicones, dyes or wavelength-converting substances, in particular garnets, aluminates, halogen phosphates, chlorosilicates, nitride-based phosphors.

The inventors of the present invention have found that the mixture permits good adhesion to the above-mentioned materials. Penetration of moisture in the contact region between the mixture and the respective material can usually be reduced in this way compared to conventional silicones without an additive. The materials in this case can be embedded, e.g., as filler particles in the mixture, which acts as a matrix. However, the mixture can also be part of an element of the optoelectronic device, while the material that differs from the mixture can be part of another element or another component in contact with the element containing the mixture. For example, the element can be directly connected to electrical conductors (wires, metallizing, other electrical contacting) which comprise a metal (e.g., Cu, Ag or Au). For example, the element comprising the mixture can be in contact with another element comprising or consisting of glass, a polymer or a silicone without the fluoro-organic additive. Said polymer can in this case be, for example, polyphthalamide (PPA), polycyclohexylenedimethylene terephthalate (PCT), polybutylene terephthalate (PBT) or polyether ether ketone (PEEK) or mixtures thereof.

In this way, the penetration of moisture between different elements or components of the optoelectronic device can be reduced. This also has a positive effect on chemical resistance.

According to another embodiment of the optoelectronic device according to the invention, the fluoro-organic additive of the mixture can enter into a chemical reaction with the surface of the material that differs from the mixture, e.g., with the surface of filler particles or the surface of an element or component of the optoelectronic device which consists of or comprises the material that differs from the mixture. In particular, an anchoring of the fluoro-organic additive to filler surfaces or other surfaces can take place with the functional group of the fluoro-organic additive, with the formation of a covalent bond. The inventors of the present invention have recognized that, in this way, a particularly good bonding of the mixture with the material that differs from the mixture can take place.

In addition to the optoelectronic device according to the invention, the invention also relates to a method for producing an optoelectronic device. The method according to the invention comprises the following steps:

A) preparing a radiation-emitting or radiation-detecting semiconductor

B) producing a mixture of the silicone and the fluoro-organic additive

C) producing one of the following elements using the mixture:

a package body element, which surrounds the at least one semiconductor at least in places, a radiation-guiding element, which is arranged in a beam path of the radiation emitted by the semiconductor or detected by the semiconductor, a heat-conducting element, which can conduct heat emitted by the semiconductor or received by the semiconductor, an adhesive element.

Using the method according to the invention, the mixture and the optoelectronic device comprising elements containing the mixture can be produced simply and cost-effectively. The mixture can be processed using established processes which are known for silicones without the fluoro-organic additive. For conventional silicones without an additive, on the other hand, additional process steps are often necessary, which can be omitted with the mixture according to the invention. Thus, processes such as low-pressure or atmospheric plasma treatment for improving the moisture and chemical resistance of package materials or other components composed of silicone are unnecessary when using the mixture with the additive.

According to a further embodiment of the method, curing of the mixture takes place in method step C). During curing, the mixture solidifies and forms the finished element for the optoelectronic device. Typical temperatures for curing are, e.g., temperatures between 60 and 200° C., preferably between 100 and 180° C., for example, 150° C.

Another development of the method according to the invention relates to the method wherein, during curing, a reaction of the fluoro-organic additive takes place, forming a covalent bond with the silicone. For example, a binding to the silicone can take place by a reaction of the silicone with a hydroxyl, epoxy or vinyl group of the fluoro-organic additive.

For the person skilled in the art, it is readily apparent that more than one of the above-mentioned steps can also be combined.

The invention further relates to the use of the optoelectronic device according to the invention in outdoor applications. Owing to the high moisture, temperature and chemical resistance, the devices according to the invention are clearly more robust and durable than conventional devices when used in outdoor applications.

BRIEF DESCRIPTION OF THE DRAWINGS

Further details, features and advantages of the present invention can be taken from the following description of the figures and the exemplary embodiments.

The figures show the following:

FIG. 3 shows a cross-sectional diagram through a further exemplary optoelectronic device according to the present invention, wherein the mixture can be contained in one or more of the elements shown.

DETAILED DESCRIPTION OF ILLUSTRATIVE EMBODIMENTS

Figure 1:
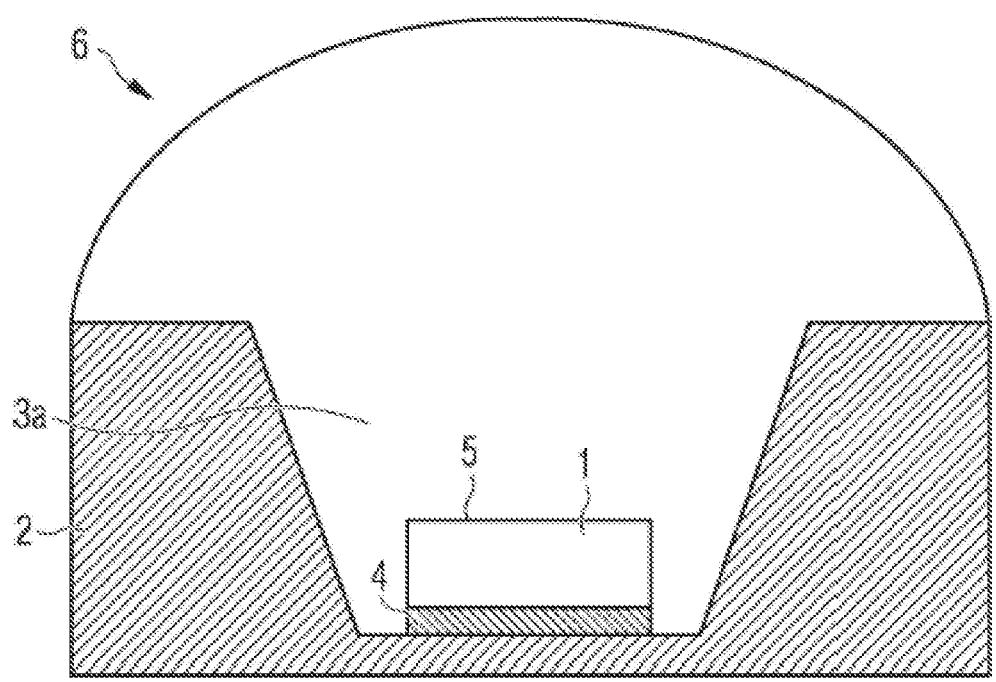
FIG. 1 shows a cross-sectional diagram of an exemplary optoelectronic device according to the present invention, wherein the mixture has a silicone and a fluoro-organic additive can be contained in one or more of the elements shown.

An exemplary optoelectronic device (6) according to the present invention is illustrated in simplified form in FIG. 1 as a cross-sectional diagram. The device (6) can comprise a package body element (or a package body) (2), which partly surrounds an optoelectronic radiation-emitting or radiation-detecting semiconductor (1), with a radiation-emitting or radiation-detecting main surface (5). The semiconductor (1) can be connected to the package body (2), e.g., via an adhesion promoter element or an adhesion promoter (4). In the beam path or detector window of the radiation emitted by the semiconductor (1) or detected by the semiconductor, a radiation-guiding element (3) can be arranged. In the case of FIG. 1 shown by way of example, this is a potting (3*a*). The potting (3*a*) can also be formed in a dome or lens shape towards the radiation-emitting or radiation-detecting outer surface of the device. In the radiation-guiding element, a supplementary substance, e.g., a dye or phosphor, such as a wavelength-converting substance, can also be contained.

The supplementary substance can be present here, e.g., in the form of filler particles, which can be embedded in the radiation-guiding element. The package body (2), the radiation-guiding element (3)—here in the form of a potting (3a)—and the adhesive element (4) can each, independently of one another, comprise or consist of the mixture comprising the silicone and the fluoro-organic additive.

Figure 2:
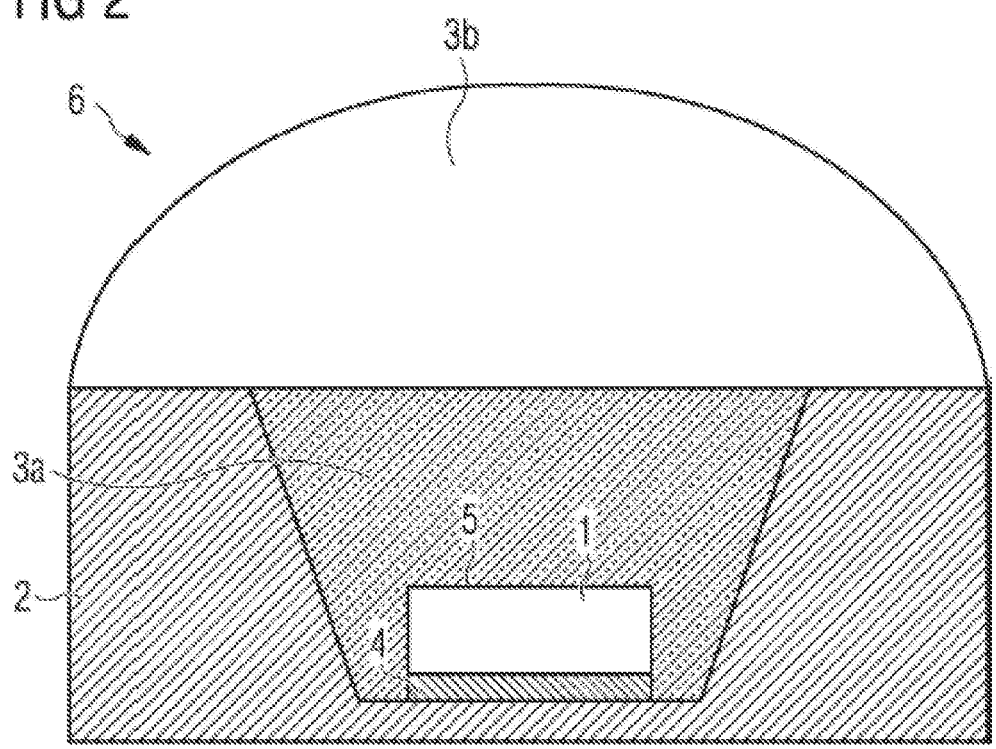
FIG. 2 shows a cross-sectional diagram through a further exemplary optoelectronic device according to the present invention, wherein the mixture can be contained in one or more of the elements shown.

FIG. 2 shows a further embodiment of the optoelectronic device (6) according to the invention. The same elements are contained as in FIG. 1, wherein a lens (3b) is additionally formed separately from the potting (3a). The lens (3b) can, like the potting (3a), contain supplementary substances.

Further elements can also be present, as shown in FIG. 3. For example, a light-converting element (3c) can be arranged in the beam path or detector window of the radiation emitted by the semiconductor (1) or detected by the semiconductor (1). Furthermore, a radiation-reflecting element (3d) can be arranged partly to the side of and opposite the radiation-emitting or radiation-detecting main surface (5) of the semiconductor (i).

The potting (3a), the lens (3b) and the light-converting element (3c) are each examples of radiation-transmitting elements. Together with the radiation-reflecting element (3d), they jointly form a group of radiation-guiding elements (3).

One or more of the illustrated elements (2), (3a), (3b), (3c), (3d) and (4) can each, independently of one another, contain or consist of the mixture comprising the silicone and the fluoro-organic additive. It is also possible that they comprise or consist of the mixture as a matrix and additionally at least one filler embedded in this matrix.

Not shown, but also possible, is the presence of a heat-conducting element. For example, it is possible that the package (2), the adhesive element (4) or the potting (3a) additionally comprises heat-conductive particles. In this case, the package (2), the adhesive element (4) and the potting (3a) are at the same time heat-conductive elements within the meaning of the invention. However, other elements of the optoelectronic device can also comprise heat-conductive particles and thus form heat-conductive elements.

Furthermore, it is readily apparent to the person skilled in the art that not all of the illustrated elements have to be present, but that various combinations and sub-combinations of the illustrated elements can be present.

Examples of mixtures according to the invention will be specified below.

Various compositions of the mixture according to the invention were investigated and compared with a silicone without a fluoro-organic additive.

The silicones of the compositions investigated were a conventional, commercially available, heat-curing, addition-crosslinking, two-component silicone. 1,1,2,2-Tetrahydroperfluorooctanol was used as the fluoro-organic additive, and was added to the silicone in various proportions. The structural formula of 1,1,2,2-tetrahydroperfluorooctanol is:

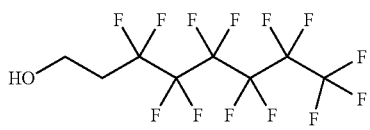 [SMILES: OCCC(F)(F)C(F)(F)C(F)(F)C(F)(F)C(F)(F)C(F)(F)F]

A composition with 0 wt. % of 1,1,2,2-tetrahydroperfluorooctanol in the mixture—i.e., the silicone without the addition of a fluoro-organic additive—was used as a reference. Further compositions comprise 0.2, 0.5, 2 and 5 wt. % of the 1,1,2,2-tetrahydroperfluorooctanol.

The compositions were each cured for one hour at 150° C. Then, the properties of the mixtures obtained were determined (see, e.g., Table 1).

TABLE 1

Properties of the mixtures after curing. The Shore A hardness was determined using a hardness tester in accordance with DIN 53505, ASTM D676 at ambient temperature.

| | 1,1,2,2-Tetrahydroperfluorooctanol in wt. % | | | | |
|---|---|---|---|---|---|
| | 0 | 0.2 | 0.5 | 2 | 5 |
| Visual evaluation | Transparent | Transparent | Transparent | Transparent | Slightly hazy |
| Bubble formation during curing | Low | Low | Low | Low | Moderate |
| Tack | Low | Low | Low | Low | Low |
| Shore A hardness at RT before exposure | 41 | 42 | 42 | 42 | 42 |
| Shore A hardness at RT after 6 weeks at 150° C. | 41 | 46 | 46 | 46 | 46 |

The data show that, if the proportion of fluoro-organic additive is too high, the transparency decreases and haze can occur. In addition, too large a quantity of the additive can lead to bubble formation. Compared to conventional silicones with 0 wt. % of additive, the hardness can be successfully increased. This represents an important advantage of the mixture according to the invention compared to conventional silicones.

The behavior of the mixtures according to the invention with respect to moisture and temperature is shown in Table 2 by way of example with the aid of the mixture with 2 wt. % 1,1,2,2-tetrahydroperfluorooctanol. As a reference, the measured values for the silicone without 1,1,2,2-tetrahydroperfluorooctanol are given.

TABLE 2

Behavior with respect to moisture and temperature

| | 1,1,2,2-Tetrahydroperfluorooctanol in wt. % | |
|---|---|---|
| Weight change in % | 0 | 2 |
| After one week at 85° C. and 85% relative humidity | +0.12 | +0.02 |
| After secondary drying | +0.12 | No change |

It can be seen from the measured values that the mixture according to the invention exhibits lower moisture absorption and a lower loss of mass, and thus improved hydrolytic stability, compared to the conventional silicone without fluoro-organic additive under thermal load. The mixture thus ensures improved moisture and weathering resistance.

The water vapor transmission of the mixtures was also investigated. The water vapor transmission was determined using a Pematron-W instrument from Mocon at 37.8° C. and 90% relative humidity in accordance with ASTM F-1249. The test specimen separated two test chambers from one another, wherein the relative humidity was set and controlled at 90% in one test chamber and the moisture diffusing through the sample was carried to an IR transmitter by dry nitrogen and quantified by means of the IR sensor in the other sample chamber. The results are shown in Table 3 for the mixture with 2 wt. % 1,1,2,2-tetrahydroperfluorooctanol by way of example. Measurements were performed here with various addition-crosslinking, two-component silicones of different hardnesses. The effect of the hardness of the silicones on the properties of the mixture is highlighted here with the aid of two silicones by way of example. Silicone 1 is a soft potting silicone (Shore A 40), while silicone 2 represents a hard lens silicone (Shore A 80). The two silicones were each investigated with a proportion of 2 wt. % 1,1,2,2-tetrahydroperfluorooctanol and, as a reference value, without the addition of 1,1,2,2-tetrahydroperfluorooctanol to establish their water vapor transmission.

TABLE 3

Water vapor transmission

| Water vapor transmission in [g/m² d] | 1,1,2,2-Tetrahydroperfluorooctanol in wt. % | |
|---|---|---|
| | 0 | 2 |
| Silicone 1 | 152 | 136 |
| Silicone 2 | 138 | 106 |

The water vapor transmission can therefore be reduced by at least 10% and even, for harder silicones, by more than 25%. Reduced water vapor transmission is proof of improved stability towards moisture and guarantees a lower tendency towards delamination. It also indicates improved chemical resistance in general.

The investigation into the thermal expansion behavior showed that the mixture according to the invention with, for example, a proportion of 2 wt. % 1,1,2,2-tetrahydroperfluorooctanol at a rate of heating of 3 K/min (measured after a treatment of 6 weeks at 150° C.) has a thermal expansion of only 402 ppm/K, while without the additive the thermal expansion (measured after 6 weeks at 150° C.) is 441 ppm/K. The rate of heating during the measurement was 3 K/min under He; the values refer to the temperature range of −50 to 260° C. The lower thermal expansion of the mixture according to the invention brings advantages for the composite stability of the optoelectronic device.

The yellowing behavior of the mixture with a proportion of 2 wt. % 1,1,2,2-tetrahydroperfluorooctanol was also investigated. Even after 6 weeks' exposure to a temperature of 85° C. and 85% humidity, no yellowing was observed.

The description with the aid of the exemplary embodiments does not limit the invention thereto. Rather, the invention comprises any new feature and any combination of features, which in particular includes any combination of features in the patent claims, even if this feature or this combination is not per se explicitly stated in the patent claims or exemplary embodiments.

The invention claimed is:

1. An optoelectronic device comprising:
   at least one radiation-emitting or radiation-detecting semiconductor; and
   a mixture comprising silicone and a fluoro-organic additive, wherein the mixture is a component of at least one of the following elements:
   a package body element surrounding the at least one semiconductor at least in places,
   a radiation-guiding element arranged in a beam path of a radiation emitted by the semiconductor or detected by the semiconductor,
   a heat-conducting element configured to conduct heat emitted by the semiconductor or received by the semiconductor,
   an adhesive element.

2. The optoelectronic device according to claim 1, wherein the fluoro-organic additive is a compound comprising a functional group selected from a hydroxyl group, an epoxy group, or a group having a C=C double bond, and wherein the functional group is covalently bound to an at least partly fluorinated alkyl group.

3. The optoelectronic device according to claim 2, wherein the fluoro-organic additive additionally comprises a linker group arranged between the functional group and the at least partly fluorinated alkyl group.

4. The optoelectronic device according to claim 2, wherein the at least partly fluorinated alkyl group is a perfluorinated alkyl group.

5. The optoelectronic device according to claim 2, wherein the functional group of the fluoro-organic additive is bound to the silicone by a covalent bond.

6. The optoelectronic device according to claim 1, wherein the fluoro-organic additive has the following general formula:

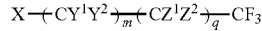

wherein the functional group X is selected from:

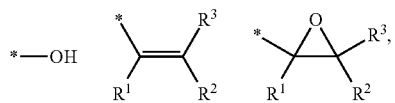

wherein $R^1$, $R^2$ and $R^3$, independently of one another, are a short-chain alkyl ($C_1$-$C_3$) or a hydrogen,
wherein $Y^1$, $Y^2$, $Z^1$ and $Z^2$, independently of one another, are selected from: fluorine, hydrogen, short-chain alkyl ($C_1$-$C_3$),
wherein m is an integer between 0 and 12,
wherein q is an integer between 1 and 19,
wherein at least one of the two substituents $Z^1$ or $Z^2$ is fluorine or an at least partly fluorinated short-chain alkyl ($C_1$-$C_3$), and
wherein m+q≤19.

7. The optoelectronic device according to claim 1, wherein the fluoro-organic additive has the following general formula:

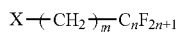

wherein X is selected from:

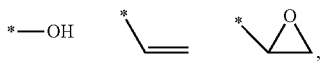

wherein m is an integer between 0 and 12,
wherein n is an integer between 2 and 20, and
wherein m+n 20.

8. The optoelectronic device according to claim 1, wherein the silicone and the fluoro-organic additive have at least partly reacted with one another.

9. The optoelectronic device according to claim 1, wherein a proportion of the fluoro-organic additive in the mixture is between 0.2 wt. % and 10 wt. %.

10. The optoelectronic device according to claim 1, wherein the mixture has an interface with a material that differs from the mixture.

11. The optoelectronic device according to the claim 10, wherein the mixture is a matrix material and the material that differs from the mixture comprises filler particles, which are embedded in the matrix material.

12. The optoelectronic device according to claim 10, wherein the material that differs from the mixture is selected from the group consisting of a metallic material, heat-conductive carbon materials, oxides, nitrides, carbides, fluorides, carbonates, sulfonates and/or ceramic material, glass, polymers, silicones, and dyes or wavelength-converting substances.

13. A method for producing an optoelectronic device, the method comprising:
providing a radiation-emitting or radiation-detecting semiconductor; and
producing a mixture of silicone and a fluoro-organic additive
providing one of the following elements using the mixture:
a package body element surrounding the semiconductor at least in places,
a radiation-guiding element arranged in a beam path of the radiation emitted by the semiconductor or detected by the semiconductor,
a heat-conducting element configured to conduct heat emitted by the semiconductor or received by the semiconductor,
an adhesive element.

14. The method according claim 13, further comprising curing the mixture while providing one of the elements.

15. The method according to claim 13, wherein curing the mixture comprises reacting the fluoro-organic additive with the silicone thereby forming a covalent bond with the silicone.

16. An optoelectronic device comprising:
at least one radiation-emitting or radiation-detecting semiconductor; and
a mixture comprising silicone and a fluoro-organic additive, wherein a proportion of the fluoro-organic additive in the mixture is between 1 wt. % and 3 wt. %, and wherein the mixture is a component of at least one of the following elements:
a package body element surrounding the at least one semiconductor at least in places,
a radiation-guiding element arranged in a beam path of the radiation emitted by the semiconductor or detected by the semiconductor,
a heat-conducting element configured to conduct heat emitted by the semiconductor or received by the semiconductor,
an adhesive element.

* * * * *

UNITED STATES PATENT AND TRADEMARK OFFICE
CERTIFICATE OF CORRECTION

PATENT NO. : 10,597,512 B2
APPLICATION NO. : 15/565116
DATED : March 24, 2020
INVENTOR(S) : Hoehn It is certified that error appears in the above-identified patent and that said Letters Patent is hereby corrected as shown below:

In the Claims

In Column 17, Line 17, Claim 7, delete "m+n 20" and insert --$m + n \leq 20$--.

Signed and Sealed this
Eleventh Day of August, 2020

Andrei Iancu
*Director of the United States Patent and Trademark Office*